United States Patent
Ng et al.

(10) Patent No.: US 6,975,515 B2
(45) Date of Patent: Dec. 13, 2005

(54) ELECTRICAL MODULE

(75) Inventors: Kee-Yeean Ng, Penang (MY);
Kok-Hing Fo, Penang (MY)

(73) Assignee: Agilent Technologies, Inc., Palo Alto, CA (US)

(*) Notice: Subject to any disclaimer, the term of this patent is extended or adjusted under 35 U.S.C. 154(b) by 18 days.

(21) Appl. No.: 10/344,587

(22) PCT Filed: Aug. 15, 2001

(86) PCT No.: PCT/US01/25492

§ 371 (c)(1),
(2), (4) Date: Jun. 6, 2003

(87) PCT Pub. No.: WO02/15655

PCT Pub. Date: Feb. 21, 2002

(65) Prior Publication Data

US 2004/0123995 A1 Jul. 1, 2004

(51) Int. Cl.[7] .................... H05K 5/00; H05K 5/04; H05K 5/06
(52) U.S. Cl. .................. 361/759; 361/801; 361/740; 361/732; 361/726; 361/747
(58) Field of Search ................ 361/732, 747, 361/726–727, 740–741, 754, 756, 759, 801–802, 796, 752, 753, 728, 730, 684–686, 788; 439/325, 326

(56) References Cited

U.S. PATENT DOCUMENTS

| | | | |
|---|---|---|---|
| 5,261,550 A | | 11/1993 | Karpisek .................. 220/4.33 |
| 5,387,133 A | * | 2/1995 | Tondreault et al. ......... 439/637 |
| 5,528,466 A | * | 6/1996 | Lim et al. .................. 361/820 |
| 5,552,961 A | * | 9/1996 | Van Gaal et al. ........... 361/700 |
| 5,597,084 A | | 1/1997 | Parasin ...................... 220/4.28 |
| 5,767,443 A | * | 6/1998 | Farnworth et al. ............. 174/50 |
| 6,073,768 A | | 6/2000 | McCord et al. ............. 206/408 |
| 6,227,630 B1 | * | 5/2001 | Brown et al. ............. 312/223.2 |
| 6,480,390 B2 | * | 11/2002 | Matsumiya et al. ........ 361/736 |
| 6,587,348 B2 | * | 7/2003 | Kondo ........................ 361/741 |
| 6,623,343 B2 | * | 9/2003 | Kajiwara et al. ........... 451/398 |
| 6,729,892 B2 | * | 5/2004 | Takada et al. .............. 439/159 |
| 2001/0028772 A1 | * | 10/2001 | Shirai et al. .................. 385/92 |
| 2004/0033031 A1 | * | 2/2004 | Zoborsky et al. ............. 385/89 |

FOREIGN PATENT DOCUMENTS

| AU | 284745 | 9/1963 |
|---|---|---|
| EP | 0727359 | 2/1996 |
| WO | 9515308 | 11/1995 |

* cited by examiner

*Primary Examiner*—Amir Zarabian
*Assistant Examiner*—Thanh Y. Tran

(57) ABSTRACT

An optical encoder module includes a housing that includes at least one recess having an open end and an opposite closed end, and an electrical component accommodated within the recess. A first locking member is formed on the electrical component and a second locking member is formed in the housing. The first and second locking members are engaged with each other for locking the electrical component, when inserted into said recess, into a locking position. At least one resiliently compressible protrusion is provided between the electrical component and the closed end of the recess so as to be resiliently compressed therebetween into its compressed state when the electrical component is locked in the recess in its locking position.

13 Claims, 3 Drawing Sheets

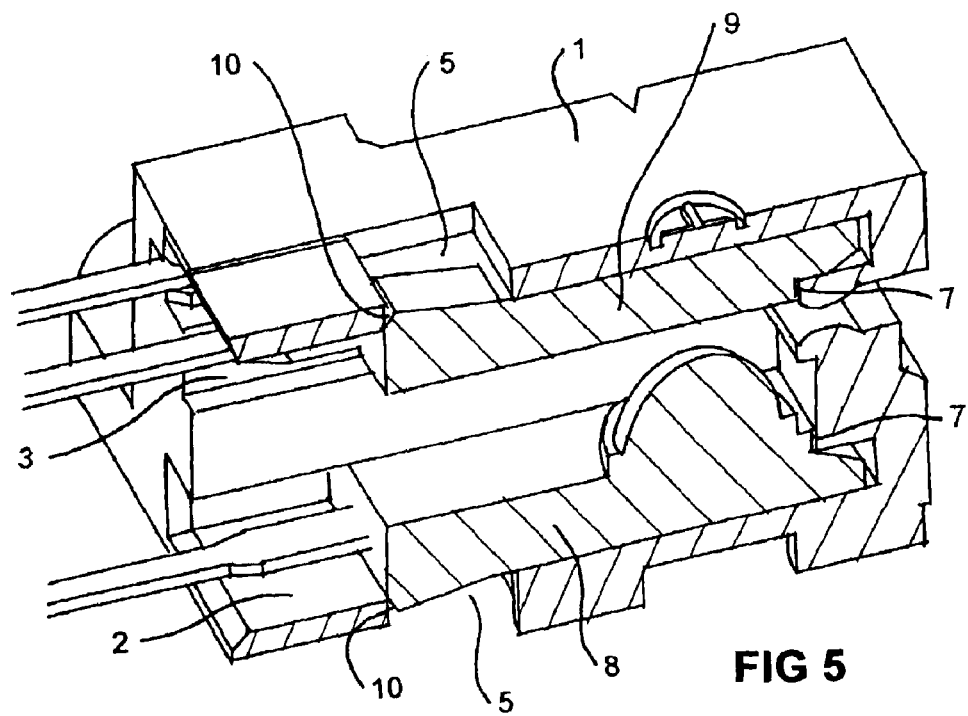
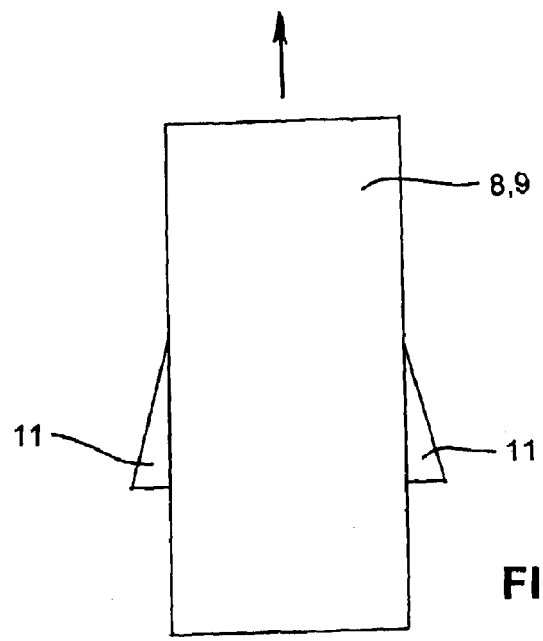
FIG 5
FIG 6

ELECTRICAL MODULE

FIELD OF THE INVENTION

The present invention relates to an optical encoder, especially to an optical encoder module having an optical emitter and an optical detector spaced apart from each other, but aligned to and interlocked with respect to each other within a housing.

BACKGROUND OF THE INVENTION

In an optical encoder module, the emitter and the detector have to be spaced apart from each other and aligned to each other such that, for example, a code card or a code wheel drawn or rotated, respectively, in a gap between the emitter and the detector can be detected and read by the encoder. Light emitted by the emitter is either blocked or passed by the code card or wheel and then detected by the detector. Therefore, it is important that the emitter and the detector are exactly aligned to each other, i.e. the emitter and the detector have to accurately overlap each other.

U.S. Design Pat. No. 329,193 discloses an optical encoder module having an optical emitter and an optical detector, the emitter and the detector being each provided with a solid molded housing, wherein both the emitter and detector housings are held together by means of a bracket. The bracket has a locking plate including a locking opening. The optical encoder module (i.e. one of the housings) has a locking protrusion that engages with the locking opening of the locking plate. Ribs are formed inside the bracket, and the emitter and detector housings are provided with laterally elongated grooves for receiving the ribs of the bracket.

However, since the emitter and detector housings can be manufactured with certain tolerance values and therefore with some accuracy only, once the respective housings are held together with the bracket, the emitter and the detector can be offset relative to each other resulting in deterioration of the detecting operation. This problem can further be deteriorated by mechanical inaccuracy of the bracket and an inaccurate engagement of the ribs of the bracket with the elongated grooves in the emitter and detector housings.

Other known arrangements do not mold the emitter and detector components in respective housings. In this case, the emitter and detector components are only provided with a simple encapsulation and are mechanically inserted into separately manufactured housings.

Inserting components inside a housing is a well-known operation in many assembly processes. In many cases, the components need to be fitted tightly and snugly inside the housing such that they maintain their positional orientations vital to the functioning of the completely mounted assembly. However, the dimensions of the components as well as the housings are subject to fabrication tolerances that cause the components to have slightly different dimensions. Because of these dimensional variations, matching problems may arise when the components and the housing or housings are mounted into an assembly.

In the assembly process where components are being inserted into respective recesses of a housing, it is important that the tolerances of both the components and the recesses are compatible. For perfect matching, the dimensions of, e.g the length of the recess should be equal to the dimensions, e.g. the length of the component. However, there are tolerances in both of these dimensions. When the length of the component is at maximum dimension and the length of the recess is at minimum dimension, it may even happen that the component cannot be inserted into the housing. Conversely, when the length of the component is at minimum dimension and the length of the recess is at maximum dimension, the component will be too loose after insertion into the housing.

In order to ensure that all components be inserted into the housing, the tolerances are typically specified such that the maximum dimension of the component is equal to the minimum dimension of the respective recess in the housing. In this case, a mismatch of the component and the housing is prevented.

Furthermore, in order to ensure an accurate positional orientation of the component in the respective housing, generally glue, adhesive, a clip or a plug is used to secure the component in the housing. In other cases, after insertion of the electrical component into the housing, the housing is deformed through heat staking such that the component is jammed tight inside the housing. In other instances, a mechanical catch or latch is used. Yet in other cases, the component is sized such that there is mechanical interference between the component and the corresponding recess during the component insertion process.

Such methods are successfully used in the industry but they suffer from limitations. Glue, adhesive, plugs or clips represent additional materials that naturally incur extra costs. In addition, an extra process step is needed to handle these materials prior to or after component insertion. This makes the assembly process more complicated and increases the cost of manufacturing. In some cases mechanical catches or latches cannot be applied because it is very difficult or even impossible to make them, and mechanical interference can lead to deformation of the housing, and thereby to the formation of cracks in the housing and/or the components.

SUMMARY OF THE INVENTION

One feature of the present invention is to provide an optical encoder module in which components are tightly fitted inside a housing after insertion of the components into the housing.

Another feature of the present invention is to provide an optical encoder module in which components are tightly fitted inside a housing after insertion of the components into the housing, and the differences in the dimensions of the components and that of the housing due to variations in the respective manufacturing processes are securely compensated for.

A further feature of the present invention is to simplify the assembly process of an optical encoder module with an emitter and a detector spaced apart such that the overall manufacturing costs are reduced.

In accordance with one embodiment of the present invention, an optical encoder module includes a housing that includes at least one recess having an open end and an opposite closed end, and an electrical component (e.g., an emitter or a detector) accommodated within the recess. A first locking member is formed on the electrical component and a second locking member is formed in the housing. The first and second locking members are engaged with each other for locking the electrical component, when inserted into said recess, into a locking position. At least one resiliently compressible protrusion is provided between the electrical component and the closed end of the recess so as to be resiliently compressed therebetween into its compressed state when the electrical component is locked in the recess in its locking position.

BRIEF DESCRIPTION OF THE DRAWINGS

FIGS. 4 and 5 are perspective cross-sectional views of the optical encoder module of FIG. 3, and FIG. 6 a shows a schematic plan view of an electrical component according to a further preferred embodiment of the invention.

DETAILED DESCRIPTION

Figure 1:
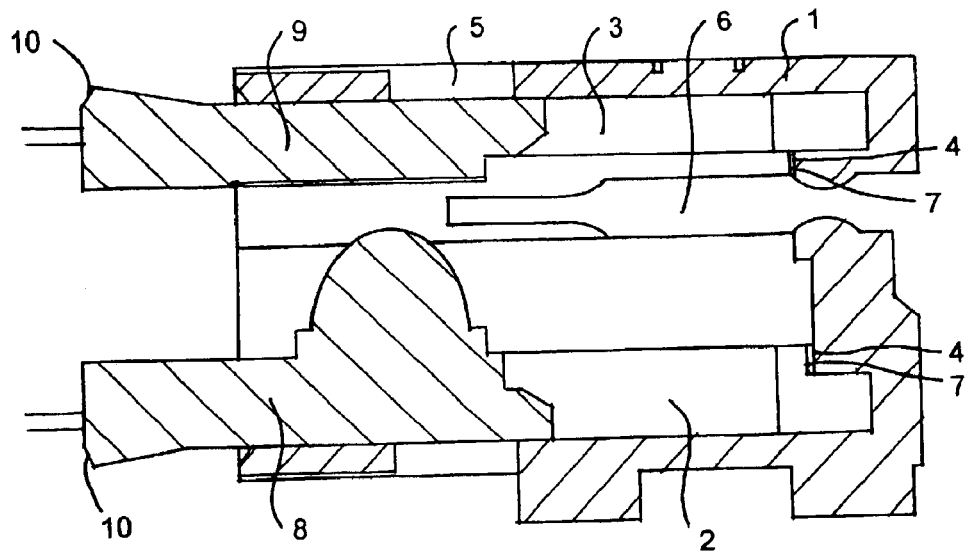
FIG. 1 is a schematic cross-sectional view of an optical encoder module according to an embodiment of the present invention, shown in a state before locking the electrical components.

Referring to FIGS. 1–6, an optical encoder module is shown that implements one embodiment of the present invention. As will be described in more detail below and in accordance with one embodiment of the present invention, the optical encoder module includes a housing 1 which has two recesses 2, 3 arranged one above the other. Each recess 2, 3 has an open end and closed end opposite to the open end, the closed end being formed by a boundary wall 4. Two locking openings 5 are formed in opposite sides of the housing 1 in overlapping relationship with the corresponding recesses 2–3. A gap 6 is formed in the housing 1 between the recesses 2–3 such that it is open to one end of the housing 1 being adjacent to the closed end of the recesses 2–3. Each recess 2, 3 is provided with two resiliently-compressible protrusions 7 protruding into the recesses 2–3, being integrally formed with the housing 1, and arranged spaced apart from each other on the boundary wall 4 of the recesses 2–3. An encapsulated optical emitter 8 is accommodated within the one recess 2, and an encapsulated optical detector 9 is accommodated within the other recess 3. Each of the encapsulation of the emitter 8 and that of the detector 9 has a locking projection 10 for engaging with the respective locking openings 5 to lock the emitter 8 and the detector 9 into a locking position in the respective one of the recesses 2–3.

The resiliently-compressible protrusion 7 allows for tight and snug fitting of the emitter 8 and the detector 9 within each of the recesses 2–3 after locking the respective component (i.e., the emitter 8 or the detector 9) by the first and second locking members or projections 10 without the use of any additional adhesive, glue, clip, plug or another attachment means or method. The arrangement and the design of the compressible protrusion 7 enable the optical encoder module to accommodate the dimensional tolerance of either the emitter 8 or the detector 9 and each of the recesses 2–3 during assembly. The arrangement and the design of the compressible protrusion 7 also cause the protrusion 7 to be able to consistently maintain the component (i.e., either the emitter 8 or the detector 9) in a tight fit within the housing 1. The resilience of the compressible protrusion 7 enables a sufficient flexibility such that the compressible protrusion 7 can be compressed to collapse to accommodate the slack due to the effect of tolerance.

If the compressible protrusion 7 is resiliently compressed into its compressed state, it will be surface forced and deformed. Therefore, the height of the protrusion 7 must be such that it is still compressed in the case of a tolerance where there is a maximum gap between the component (i.e., either the emitter 8 or the detector 9) and the closed end of each of the recesses 2–3, i.e., the height of the compressible protrusion must be larger than the maximum gap formed between the closed end of the respective one of the recesses 2–3 and the electrical component (i.e., either the emitter 8 or the detector 9) in the locking position of the electrical component. On the other hand, the protrusion 7 must be designed with regard to its compressibility such that in the case of minimum gap it can be compressed to a minimum height being equal to the width of the gap. In this latter case, the protrusion 7 is fully compressed. Practically, a small gap is desirous to accommodate the compressed protrusion 7 and, therefore, the length of each of the recesses 2–3 and that of the electrical component (i.e., either the emitter 8 or the detector 9) with the respective tolerance ranges should be dimensioned accordingly.

By forming the resiliently compressible protrusion 7 between the electrical component (i.e., either the emitter 8 or the detector 9) and the closed end of each of the recesses 2–3, the differences in dimensions of the components 8–9 and the recesses 2–3 due to variations in fabrication are securely compensated for, so that an exact and consistent positioning and locking of the components 8–9 in the housing 1 of the optical encoder module is achieved.

The compressible protrusion 7 is integrally formed on the closed end of the respective recess (i.e., 2 or 3) facing the electrical component (i.e., either the emitter 8 or the detector 9). This allows for a simple production of the housing together with the compressible protrusion with low manufacturing costs. Furthermore, by integrally forming the compressible protrusion at the closed end of the recess, the protrusion has an exactly predetermined position in relation to the bottom end of the electrical component facing the closed end of the recess so that inaccuracies in positioning the compressible protrusion by separately attaching the protrusion to the closed end of the recess are avoided. In this embodiment the housing and the compressible protrusion can be formed from the same material, and a variety of standard components can be accommodated and locked in the recess of the housing. Alternatively, each of the compressible protrusions 7 is integrally formed on the bottom end of the respective electrical component facing the closed end of the respective recess.

According to one embodiment of the invention, each of the compressible protrusions 7 is formed in a tapered shape or as a semicircular dome in order to facilitate the collapsing effect and to ensure that there is adequate space to accommodate the collapsing material. More generally, each of the compressible protrusions 7 is shaped such that it has a smaller dimension at its end facing to the bottom end of the component and being engaged in surface contact with the component. This facilitates the compression of the protrusion so that the inserting and locking operation of the component into the recess can be easily performed with low force using the resilience characteristic of the protrusion material.

Alternatively, each of the compressible protrusions 7 can be formed in a linearly elongated shape. In this case, when inserting the respective component (i.e., the emitter 8 or the detector 9) into the respective recess, the bottom end surface of the component is contacted by the linearly elongated compressible protrusion so that a uniform abutting of the component against the protrusion is ensured and the pressure acting on the bottom end of the component is uniformly distributed.

According to an embodiment of the invention, two compressible protrusions are provided side by side on the closed end of the recess. In this case, it is achieved that the bottom end of the component is uniformly aligned to the closed end of the recess of the housing to consistently maintain the component in a tight fit. The two compressible protrusions ensure that the component is properly seated.

To achieve proper deformation characteristics, the compressible protrusion 7 can be made of plastic or a malleable metal. Such materials are soft in nature and sufficiently meet the requirements regarding compression characteristics of the protrusion.

The housing 1 is integrally made of, for example, a plastic material. In addition, each of the recesses 2 and 3 has a substantially rectangular cross-sectional shape. The locking openings 5 are formed in opposite sides of the housing 1 in overlapping relationship with the corresponding recesses 2, 3. Preferably, the housing 1 and the compressible protrusion 7 formed on the closed end of the recess are made of a softer material than that of the electrical component (i.e., the emitter 8 or the detector 9) so that the compressible protrusion 7 is reliably compressed into its compressed state. In this way it is ensured that the compressible protrusion 7 made from softer material can collapse against the harder material of the electrical component. Therefore, deviations in the locking position of the electrical component are avoided which could otherwise occur due to deformations of the bottom end portion of the component that presses against the compressible protrusion. Alternatively, if the electrical component has the compressible protrusions then the housing should be made from a harder material than that of the protrusions and the electrical component.

The encapsulation of the emitter 8 and the detector 9 is made of a material that is harder than the plastic material of the compressible protrusion 7 integrally formed with the housing 1. Next, the locking operation of the emitter 8 and the detector 9 into the recesses 2, 3 is described.

Figure 2:
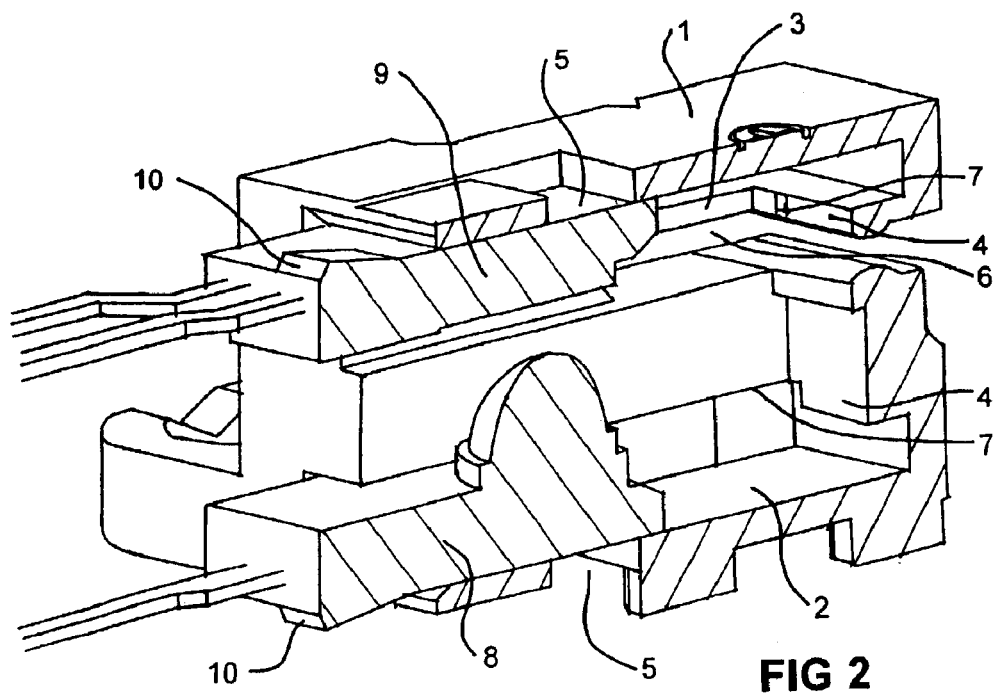
FIG. 2 is a perspective cross-sectional view of the optical encoder module of FIG. 1.

FIGS. 1 and 2 show the optical encoder module in a state before locking the emitter 8 and the detector 9. The emitter 8 and the detector 9 are inserted into the recesses 2, 3 of the housing 1 from the open end of the recesses 2, 3 in a direction toward the boundary wall 4 of the recesses 2, 3 until the compressible protrusions 7 formed at the boundary wall 4 are reached. Then, the bottom end of the emitter 8 and the detector 9 is pressed against the compressible protrusions 7 until the locking projection 10 of the emitter 8 and the detector 9 is engaged with the corresponding locking opening 5 in the housing 1.

Figure 3:
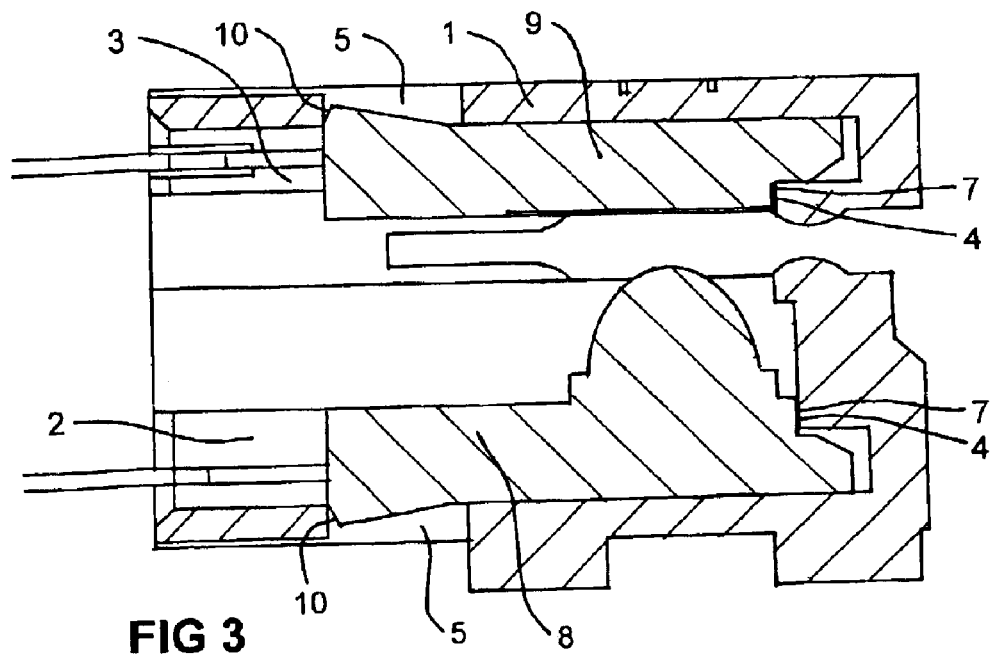
FIG. 3 is a schematic cross-sectional view of the optical encoder module of FIG. 1, wherein the electrical components are in their respective locking positions.
Figure 4:
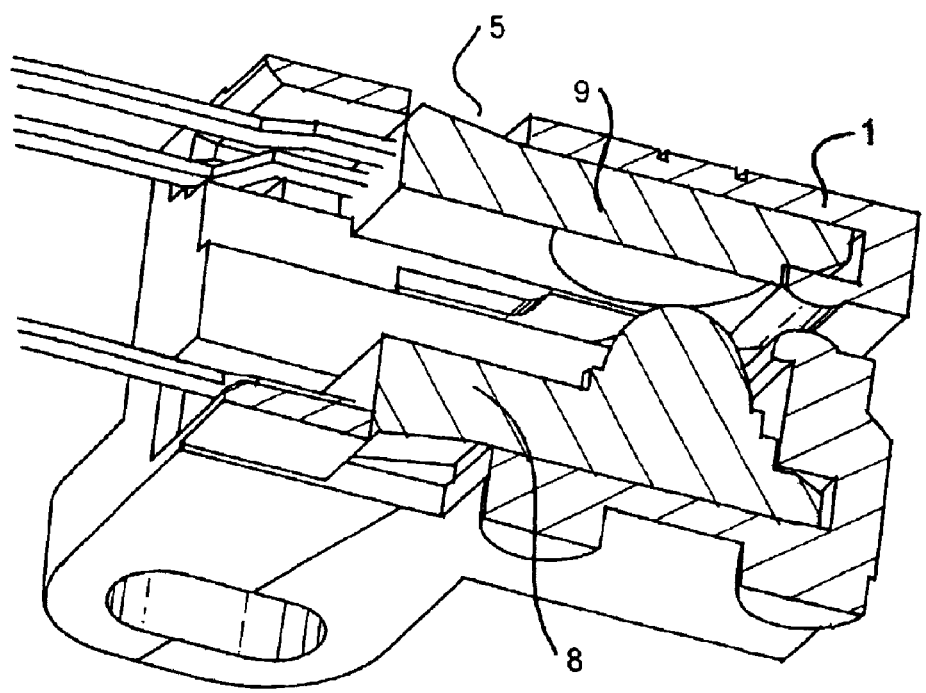

FIGS. 3 to 5 show the optical encoder module in a locking position of the emitter 8 and the detector 9. In this position, the emitter 8 and the detector 9 are completely locked in the recesses 2, 3 by engaging the locking projections 10 with the locking openings 5 of the housing 1. The compressible protrusion 7 is resiliently compressed into its compressed state between the bottom end of the emitter 8 and the detector 9, respectively, and the corresponding boundary wall 4 of the recesses 2, 3. Therefore, the emitter 8 and the detector 9 are tightly fitted in their locking position and accurately aligned to each other.

The emitter 8 and the detector 9 are spaced and aligned to each other such that a code card or wheel (not shown) drawn or rotated, respectively, through the gap 6 between the emitter 8 and the detector 9 can he detected and read by the optical encoder module. The light emitted by the emitter 8 is passed through or blocked by the code card (or code wheel) and then detected by the detector 9. Since the emitter 8 and the detector 9 are exactly aligned to each other, i.e. the emitter 8 and the detector 9 are arranged in an accurate overlapping position, a reliable operation of the optical encoder module is ensured.

As schematically shown in FIG. 6, according to a further preferred embodiment of the invention, the encapsulation of the electrical components (the emitter 8 and the detector 9) is further provided with two elongated triangle-shaped protrusions 11 on their opposite lateral sides. These protrusions 11 provide for a centering of the electrical components in the recesses 2, 3 in lateral directions when the electrical components are inserted in the respective recesses 2, 3, and thereby contribute to an even more accurate alignment of the electrical components.

What is claimed is:

1. An optical encoder module, comprising:
   a housing which includes at least one recess having an open end and an opposite closed end, the housing further including a locking opening;
   an electrical component to be accommodated within the recess, the electrical component including a locking member formed on a surface of the electrical component, wherein the locking member and the locking opening are engaged with each other for locking the electrical component, when inserted into said recess, into a locking position, and wherein unlocking the electrical component from the locking position enables removing and separating the electrical component from the housing; and
   at least one resiliently compressible protrusion between the electrical component and the closed end of the recess so as to be resiliently compressed therebetween from its uncompressed state into its compressed state when the electrical component is inserted into the recess and locked therein in its locking position.

2. The optical encoder module according to claim 1, wherein the compressible protrusion is integrally formed at the closed end of the recess facing the electrical component.

3. The optical encoder module according to claim 1, wherein the compressible protrusion is integrally formed on a bottom end of the electrical component facing the closed end of the recess.

4. The optical encoder module according to claim 2, wherein the compressible protrusion is formed in a tapered shape or in the form of a semicircular dome.

5. The optical encoder module according to claim 3, wherein the compressible protrusion is formed in a tapered shape or in the form of a semicircular dome.

6. The optical encoder module according to claim 2, wherein the compressible protrusion is formed in a linearly elongated shape.

7. The optical encoder module according to claim 3, wherein the compressible protrusion is formed in a linearly elongated shape.

8. The optical encoder module according to claim 1, further comprising a second compressible protrusion that is provided side by side with the at least one compressible protrusion.

9. The optical encoder module according to claim 2, wherein the housing and the compressible protrusion are made of a softer material than that of the electrical component.

10. The optical encoder module according to claim 9, wherein the compressible protrusion is made of plastic or a malleable metal.

11. The optical encoder module according to claim 1, wherein the housing further includes a second recess having an open end and an opposite end, wherein the recess and the second recess are arranged vertically spaced apart and are parallel to each other, and wherein the electrical component is accomodated within any one of the recess and the second recess.

12. The optical encoder module according to claim 1, wherein the electrical component is a light emitter of the optical encoder module.

13. The optical encoder module according to claim 1, wherein the electrical component is a detector of the optical encoder module.

* * * * *